United States Patent [19]

Plasek

[11] Patent Number: 5,842,158
[45] Date of Patent: Nov. 24, 1998

[54] METHOD FOR ADAPTIVE FILTERING OF WELL LOGGING DATA

[75] Inventor: Ronald E. Plasek, Houston, Tex.

[73] Assignee: Schlumberger Technology Corporation, Houston, Tex.

[21] Appl. No.: 811,992

[22] Filed: Mar. 5, 1997

Related U.S. Application Data

[60] Provisional application No. 60/011,600, Mar. 8, 1996.

[51] Int. Cl.$^6$ ..................................................... G06F 17/00
[52] U.S. Cl. ................................. 702/195; 364/724.011; 364/724.19
[58] Field of Search .................. 364/572, 724.01–724.2, 364/724.001, 724.11, 724.17, 724.19; 702/195

[56] References Cited

U.S. PATENT DOCUMENTS

| | | | |
|---|---|---|---|
| 4,044,241 | 8/1977 | Hatley, Jr. ............................. | 364/724.9 |
| 4,188,667 | 2/1980 | Graupe et al. .......................... | 364/724 |
| 5,144,595 | 9/1992 | Graham et al. ......................... | 367/135 |
| 5,303,173 | 4/1994 | Mori et al. ........................... | 364/724.19 |
| 5,432,723 | 7/1995 | Chen et al. .......................... | 364/724.01 |

FOREIGN PATENT DOCUMENTS

WO 94/29818  12/1994  WIPO .

OTHER PUBLICATIONS

Savoji, M.H., "Performance of the Variable–Length Stocharstic Gradient Lattice Filter in Adaptive Noise Cancellation of Nonstationary Signals—A Simulation Case Study", *Signal Processing*, vol. 13, No. 4, Dec. 1987, pp. 361–375.

*Primary Examiner*—John Barlow
*Assistant Examiner*—Bryan Bui
*Attorney, Agent, or Firm*—Brigitte L. Jeffery; John J. Ryberg

[57] ABSTRACT

The invention described herein provides for an intelligent or "adaptable" filtering method that could be applied when filtering log data. In the present invention, for a given filter model, the adaptive filtering technique differentiates between true changes in the formation or borehole quantity measured and what can be considered to be just a "statistical fluctuation". So, when in long constant-value intervals (data deviations do not exceed those predicted by statistical theory) the filter will automatically increase the number of filter levels used, thereby providing a large reduction (smoothing) of the statistical variations. However, when approaching a spot where there is a true change in the quantity being measured (data deviations over and above those predicted by statistics) the filter will automatically and smoothly decrease, on both sides of this spot, thereby preserving the sharpness of the bed boundary or borehole fluid contact and also preserving the true shape of a thin geologic bed.

17 Claims, 5 Drawing Sheets

$$\text{TRIANGULAR} = 0.25 X_{n-1} + 0.5 X_n + 0.25 X_{n+1}$$

METHOD FOR ADAPTIVE FILTERING OF WELL LOGGING DATA

CROSS REFERENCE TO RELATED APPLICATION

This invention is based on a provisional application filed on Mar. 8, 1996 and identified as application Ser. No. 60/011,600.

BACKGROUND OF THE INVENTION

This invention relates to the processing of well logging measurement data. In particular it relates to a method of adjusting filtering techniques applied to the data. These filtering techniques reduce statistical variations in the logs and produce a visually clearer log and more accurate well logging measurements. In the processing of nuclear well-log measurements it is customary to "depth-smooth" (depth-filter) the measurements in order to reduce the observed statistical variations. The most common filter type used is the simple arithmetic average of a fixed number "n" of depth levels. An example of such filtering is shown in FIGS. 1a and 1b using real well log data. FIG. 1 shows the well log 1 before the log is filtered. Also shown in FIG. 1 the same log 2 after the log has been filtered. The difference between the logs is obvious. Other simple filter types used include the so-called "triangular" filters and low-order polynomial. An example of one of these filters, a 3 point triangular, is given in FIG. 2. Mathematical expressions of these types of filters 3 point triangular, 3 point arithmetic and 3 point linear are given below:

$Y_{(triangular)} = 0.25 Y_{n-1} + 0.5 Y_n + 0.25 Y_{n+1}$ as shown in FIG. 2;

$Y_{(Arithmetic)} = 0.333 Y_{n-1} + 0.333 Y_n + 0.333 Y_{n+1}$ $Y_{(linear)} = a + G \cdot X_n$ where
$a = \Delta^{-1} (\Sigma x_i^2 \Sigma y_i - \Sigma x_i \Sigma x_i y_i)$
$G = \Delta^{-1} (N \Sigma x_i y_i - \Sigma x_i \Sigma y_i)$
$\Delta = N \Sigma x_i^2 - (\Sigma x_i)^2$ where $y_i$ is the data value at depth $x_i$, etc., sums are taken from n−1 to n+1 and N=3

A 3 point arithmetic average filter would apply equal weight (⅓) to each of three adjacent points. A generalized n-point filter would use equal weights equal to 1/n. A 3 point triangular filter, shown in FIG. 2, is symmetrical about the center with equal (smaller) weights on each side, for example (¼, ½, ¼). An example of a low order linear polynomial filter is illustrated in the above-listed equation. Here the filter coefficients (a, b) depend on both the X's and Y's. Further discussion for these equations and higher order polynomial coefficients can be found in textbooks on classical statistics, for example Data Reduction and Error Analysis for the Physical Sciences, Philip Bevington, McGraw-Hill 1969.

Ordinarily, this fixed-length filter is then applied over the entire logged interval. This means that the filter is applied indiscriminately and without regard to features in the data. For example, logging depth measurements are routinely taken in 6 inch increments. The normal 6" logging depth increments measurements are commonly averaged over 3, 5, 7, . . . levels, thus translating into filter lengths of 1.0 ft, 2.0 ft and 3.0 ft respectively.

Although this type of filtering does indeed reduce the observed statistical variations and results in a more visually meaningful log as shown in FIG. 1, this method of applying for example the common simple arithmetic average has several serious disadvantages:

filtering reduces the sharpness of formation bed boundaries and borehole fluid boundaries (borehole fluid "contacts");

for sufficiently narrow geological beds filtering can output a value often significantly less than the true measurement value of the bed;

any features which are less wide than the filter length will be reduced or possibly even made non-visible;

Therefore, in filtering operations a dilemma exists when trying to apply a uniform filter over the entire length of a log interval. On one hand, in order to retain good boundary/contact definition and thin bed resolution either no or very little filtering should be used. However, in order to reduce statistical variations, heavy filtering (just the opposite) should be used.

A solution to this dilemma would be an intelligent filtering method which could adapt its filter length and possibly also its filter type dynamically by adjusting itself in a smooth continuous manner to provide:

1) a "small" (down to a minimum) amount of filtering when traversing bed or contact boundaries or other statistically significant changes in the measurement readings, yet, at the same time, provide 2) a "large" (up to a maximum) amount of filtering when traversing long intervals wherein the measurement does not change in a statistically meaningful way with a filter type appropriate for the data within the filter length range.

SUMMARY OF THE INVENTION

It is an object of this invention to provide a filter for processing data in which the filter length is dynamically adjusted to depth smooth as much as possible without distorting statistically significant geological features.

The invention described herein provides for an intelligent or "adaptable" filtering method that could be applied when filtering log data. In the present invention, for a given filter model, the adaptive filtering technique differentiates between true changes in the formation or borehole quantity measured and what can be considered to be just a "statistical fluctuation". So, when in long constant-value intervals (data deviations do not exceed those predicted by statistical theory) the filter will automatically increase the number of filter levels used, thereby providing a large reduction (smoothing) of the statistical variations. However, when approaching a spot where there is a true change in the quantity being measured (data deviations over and above those predicted by statistics) the filter will automatically and smoothly decrease, on both sides of this spot, thereby preserving the sharpness of the bed boundary or borehole fluid contact and also preserving the true shape of a thin geologic bed.

For a given filter type, the adaptive filter method (algorithm) adjusts its filter length (determines the number of levels of filtering to use) based on a Chi-square-like statistic, hereafter referred to as Z $$Z = \frac{\sum_{i=1}^{N} \frac{(y_i - y_{fit\,i})}{(\sigma_{y_i}^2 + T_y^2)}}{N-1} \quad (1)$$

where N is the number of levels (depths) of data included in the calculation of Z (N being an odd integer).

$y_i$ is the measurement value at level (depth) i $y_{fit\,i}$ is the fitted value for each of the N measurement values, based on the filtering model being used $\sigma^2$ is the predicted variance (square of standard deviation) of measurement $y_i$ (square of its precision)

$T_y$ is a "tolerance" in the determination (accuracy) of the quantity y.

For example:

A $2^{nd}$ order polynomial filtering model would be $y_{fit_i} = a_0 + a_1 x_i + a_2 x^2_i$ where "x" is typically depth or time, A 3-point "triangular" filter would be $y_{fit_i} = \frac{1}{4} y_{i-1} + \frac{1}{2} y_i + \frac{1}{4} y_{i+1}$ A simple 3 point arithmetic average filter would be $$y_{fit_i} = \frac{y_{i-1} + y_i + y_{i+1}}{3}$$

The inclusion of $\sigma^2$ terms implies that one must know the statistical precision (variance) of $y_i$ at every level. This is customarily done by simply propagating nuclear (Poisson) statistics through the algorithm which transforms the raw nuclear "counts" into the measurement output y. The term $T_y$ is not found in the customary chi-square statistic.

The method of this invention also provides more benefit than simply improving the visual appearance of a log. In particular other quantities or measurements derived from the filtered quantity will also improve. The following example demonstrates how other measurements benefit from the adaptive filtering method. Suppose a quantity Q is computed from statistical logging measurements A, B, and C, denoted by Q[A,B,C]. If quantity A can be adaptively filtered (call its filtered version $\overline{A}$), then the precision of Q computed with $\overline{A}$,B,C ($\sigma_Q^2[\overline{A},B,C]$) will be better (the uncertainty will be smaller) than the precision computed using simply A,B,C ($\sigma_Q^2[A,B,C]$), since $\sigma_{\overline{A}}^2$ is smaller than $\sigma_A^2$ by a factor 1/n. Stated mathematically the result would be:

$$\sigma_Q^2[\overline{A}, B, C] = \left(\frac{\partial Q}{\partial A}\right)^2 \sigma_{\overline{A}}^2 + \left(\frac{\partial Q}{\partial B}\right)^2 \sigma_B^2 + \left(\frac{\partial Q}{\partial C}\right)^2 \sigma_C^2 \quad (2)$$

DETAILED DESCRIPTION OF THE INVENTION

The primary specific application of this adaptive filtering method of the present invention has thus far been in the filtering of borehole-related measurements. An example of this method has been applied to the "BSAL" [apparent salinity of borehole fluid] output from the reservoir characterization tools such as Schlumberger's Reservoir Saturation Tool (RST) or the "background" gamma-ray count-rate of the RST tools. In spite of the specific applications previously mentioned, there is no reason that this filtering method is not applicable to other logging measurements in general, and in particular, to the more common formation-related measurements. Also, this method has much broader applications than the commonly used simple arithmetic average filter mentioned previously.

Referring to and using equation 1 for the first part of this discussion, for simplicity, assume $T_y$ is set to 0 and that the simplest of all models is used. The quantity y is hypothesized as a constant value, within normal statistical fluctuations. In this case, the modeled (filtered) value of $y_i$ simply becomes the mean value of the N y values centered about $y_i$.

Now, if all the N $y_i$'s are derived from the same parent population (i.e., the true value in nature of y is a constant or very nearly constant value) then statistical theory predicts that the value of Z (a reduced chi-square-like statistic) will, on average, be approximately unity. That is to say, on average, the square of the amount each point $y_i$ will differ from its mean, will be approximately equal to its variance (square of the standard deviation).

Now, if all the N $y_i$'s do not come from the same parent population (i.e. are not constant), then there will be, on average, more of a departure from the mean than their statistics (standard deviation) would predict, and thus the value of Z will systematically be somewhat larger than unity.

Thus, in this example, to test whether a set of N measurements $y_i$ all come from the same parent population, a computation is made of the statistic Z and it is compared with a pre-determined "threshold value" $Z_0$, with $Z_0$ typically in the range of ~2–3. If Z is less than the threshold value $Z_0$ then the algorithm concludes that all N points come from the same parent population and thus it is legitimate to filter (compute the arithmetic average) using all N points.

Figure 1:
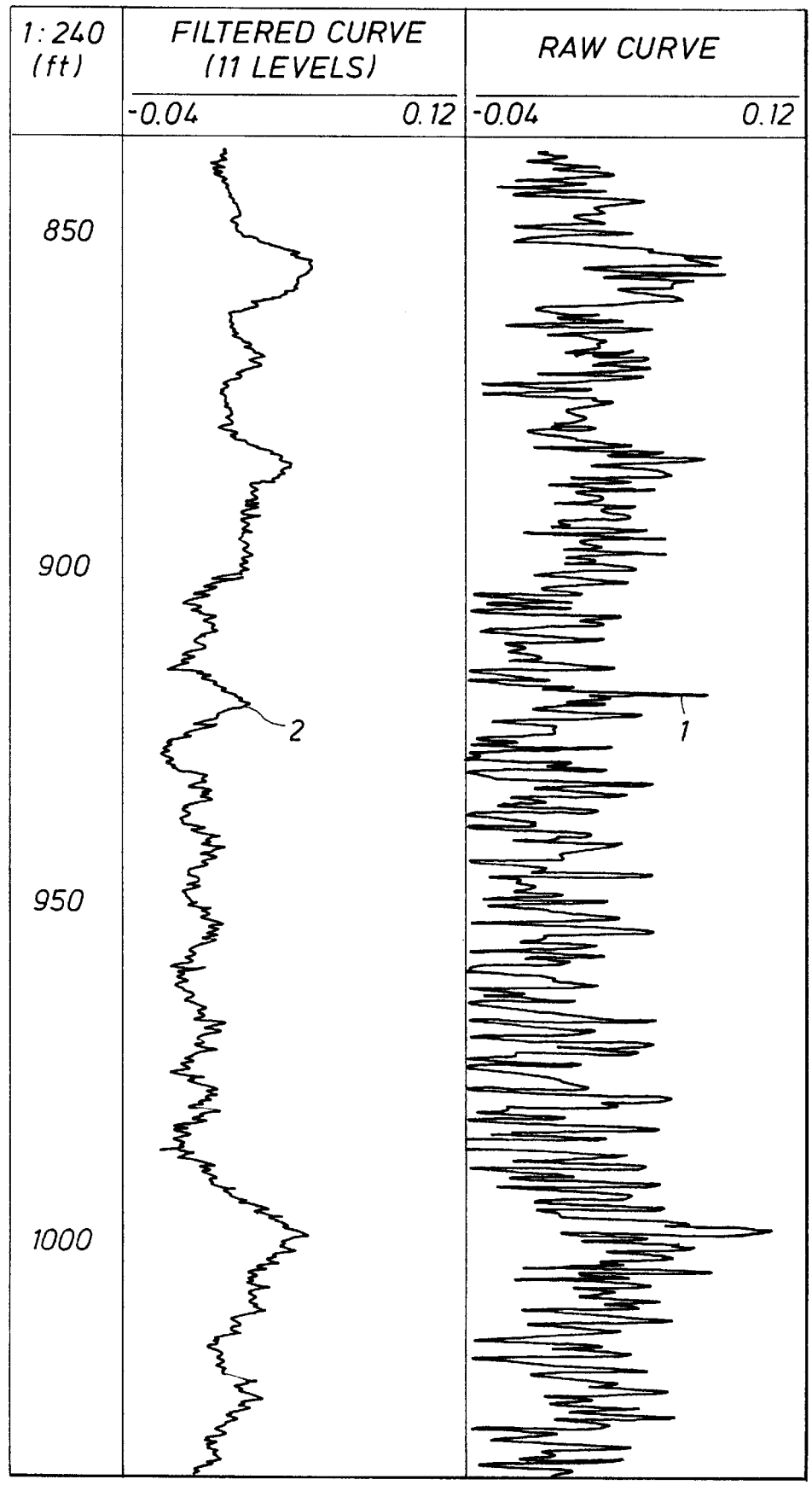
FIG. 1 is a real raw nuclear-based well-logging measurement before the log is filtered and the resultant well log after the log has been filtered with an II—level arithmetic average filter.
Figures 2, 3:
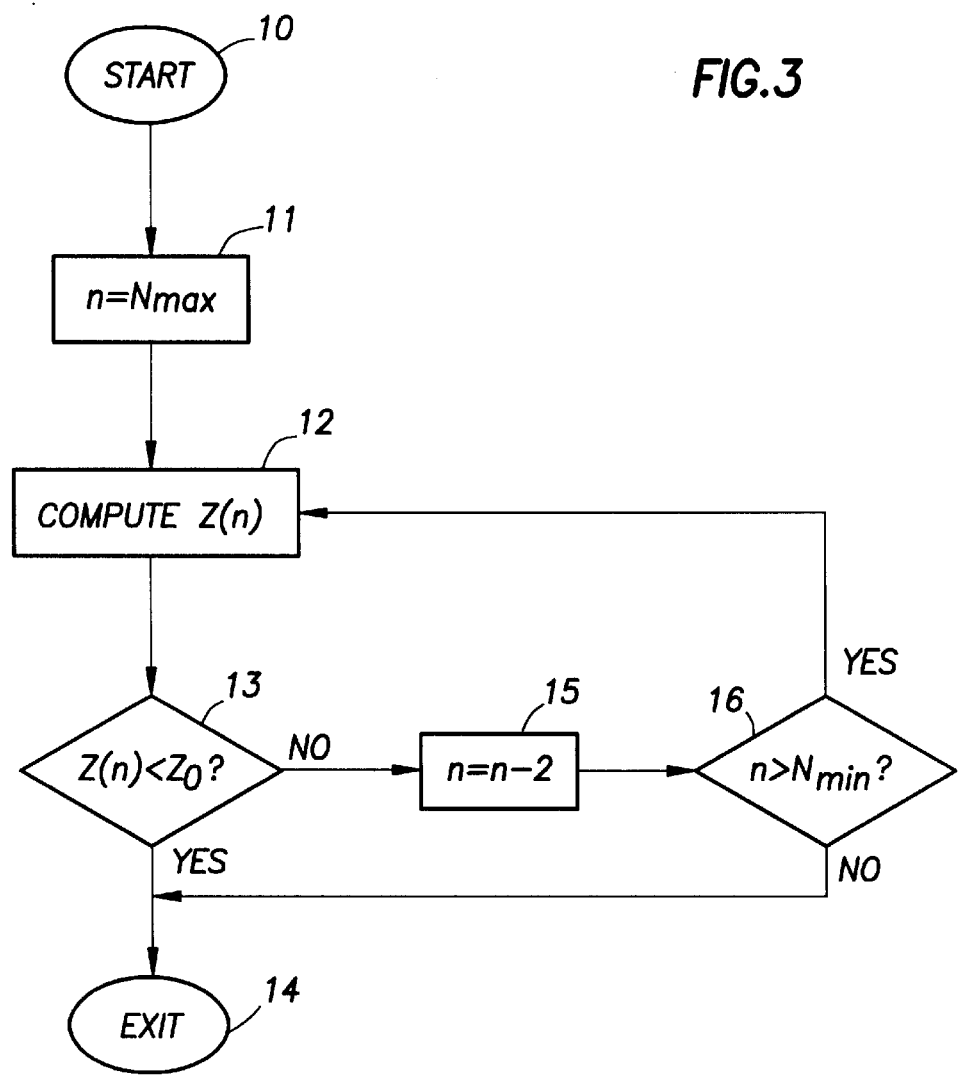
FIG. 2 shows a "triangular" filter.
FIG. 3 shows a flow diagram of an adaptive filter algorithm of the present invention.

The sequence of the invention can be demonstrated in FIG. 3. As the method starts 10, the initial value of N is set to $N_{max}$ 11 which is the maximum number of levels of filtering permitted for the given application. For example, filter length values for $N_{min}$ and $N_{max}$ appropriate for the filtering of RST BSAL would be $N_{min}$: 3 levels (i.e., a 1.0 ft filter length)

$N_{max}$: 51 levels (i.e., a 25 ft filter length)

A computation 12 of Z is made and it is compared 13 to the pre-determined threshold $Z_0$. If Z is less than $Z_0$. then the algorithm concludes as stated before that all N points come from the same parent population and this filter length is appropriate to filter. The algorithm then exits 14.

On the other hand, if Z computes to be greater than the threshold $Z_0$ then the algorithm concludes that all N points do not come from the same parent population and thus that all N points can not be used in the filter. Based on this finding, the algorithm recomputes Z using fewer points, in particular the N-2 points 15 numbered 2 through N-1 (i.e., the deepest and shallowest points are removed). If n is still greater than $N_{min}$ 16, a new Z is computed 12 and retested against $Z_0$ 13. If Z is less than $Z_0$, the N-2 points are used in the arithmetic average and the algorithm exits 14. If it fails the test 13 then two more points (points "2" and "N-2") are removed and Z is again recomputed 12 and retested against $Z_0$ 13. This process continues until either:

1) Z passes the threshold test 13 (is less than $Z_0$) or
2) the number of points used to compute Z hits a predefined lower limit ($N_{min}$) 16.

At this point, the algorithm may simply exit and use the results obtained with the $N_{min}$ points. Alternatively, the algorithm may modify the filter model type and reiterate the filter-length loop in an attempt to obtain a better fit (a smaller Z) using a number of samples N somewhere between $N_{min}$ and $N_{max}$.

The discussions thus far have assumed that variations in the measured quantity y were due solely to statistical fluctuations. This is, however, not 100% true. Although statistical theory does indeed account for almost all the data-fluctuations, there exists a lower limit in the accuracy to which we can determine the quantity y. This lower limit is represented in the previously mentioned "tolerance factor" $T_y$.

Sources of non-statistical deviations in for example the BSAL borehole salinity measurement include environmental effects (for example, coupling between the formation and borehole apparent capture cross-sections), variations in gain regulation, "road noise" (non-uniform mechanical application of the logging tool against the borehole or casing wall), and variations in source strength. In addition, for tools which often require multiple-pass logging operations and the subsequent combining ("stacking") of those passes into one, there are additional sources of possible measurement bias. These include differences in depth alignment between passes, differences in tool "track" (side of the hole on which the tool moves) between passes, differences in "road noise" between passes, differences in tool and detector temperatures between passes, and so forth.

In actual applications of the invention, borehole-related measurements make excellent candidates for adaptive filtering since, for typical wells, there are often no more than 2 or 3 places where there are true changes in the borehole environment for example, changes in borehole size, changes in casing or tubing size or weight, or fluid "contacts" between columns of segregated oil, waters of different salinities, and/or drilling fluids, gas, etc. At such places in the well, the adaptive filter will decrease to use a small amount of filtering while in most intervals of the well it will be able to apply relatively heavy amounts of filtering. Examples of borehole-related measurements would be the "borehole sigma" from a PNC (pulsed-neutron capture) logging tool [SBHN from TDTP or SBNA from RST] or calibrated derived quantities such as "apparent salinity of borehole fluid" derived from them [BSAL from TDTP or RST].

Figure 4:
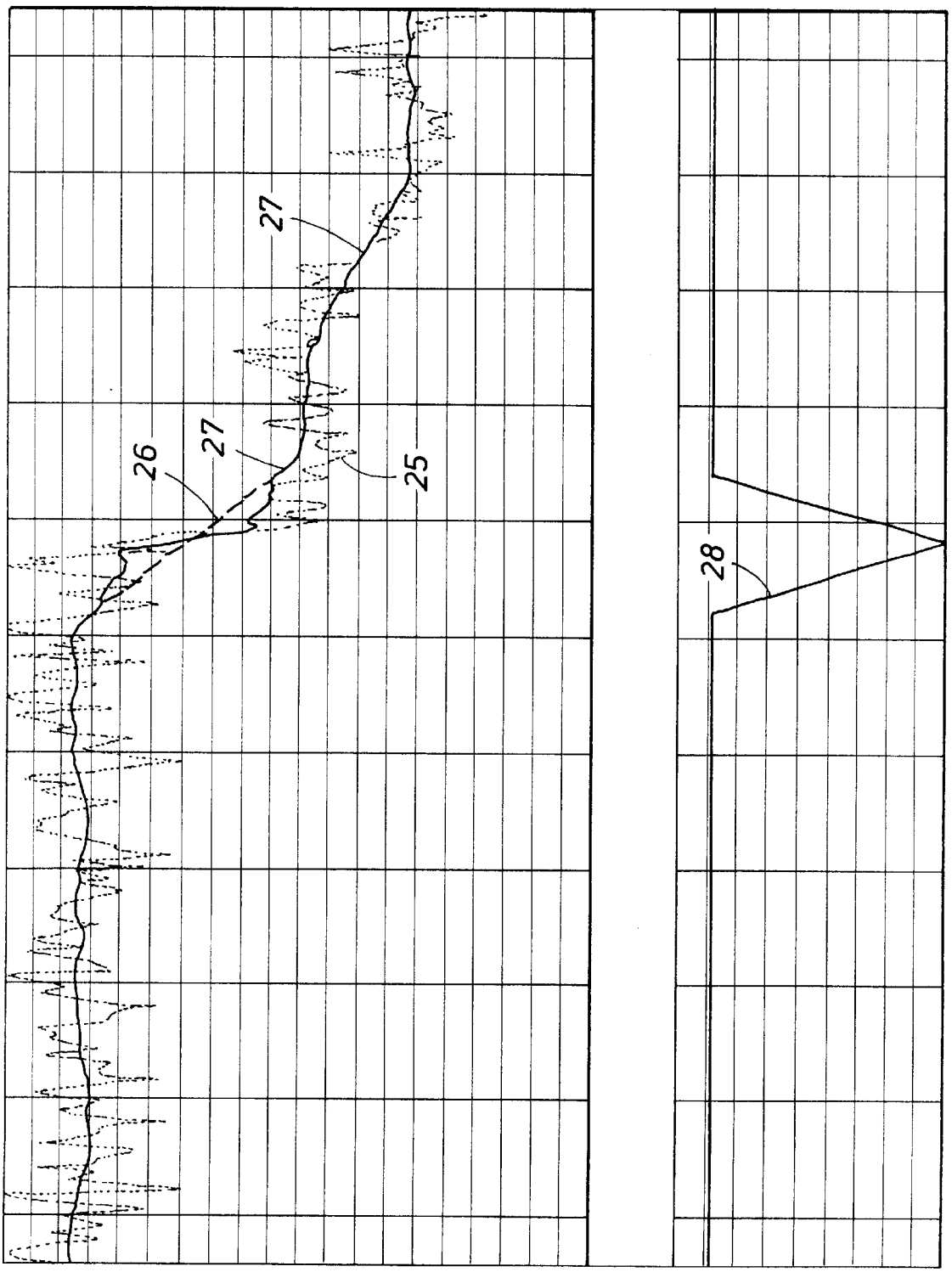
FIG. 4 shows a section of an apparent salinity of borehole fluid (BSAL) measurement and demonstrates the benefit of adaptive filtering over simple arithmetic averaging filtering.

FIG. 4 shows a section of the RST-derived "BSAL" measurement in a shut-in well. In FIG. 4, the dotted curve 25 has had no filtering whatsoever applied to the data. The inherent "6-inch BSAL statistics" are clearly seen. However, the trained eye will glean that there seem to be 3 sections of different and roughly constant BSAL:

1) above x658 ft (which has crude oil in the borehole)
2) between x658 and x870 ft, which has some saline drilling or produced fluid
3) below x870 ft, which has some other saline drilling or produced fluid (being more saline than the section above).

Curve 26, which for the most part is over-written by curve 27, shows the same data with a (non-adaptive) constant 51-level (25 ft) filter applied. Clearly the data has been significantly "smoothed" but note that the contacts between the three borehole fluid sections have been significantly degraded, especially the one at x658 ft., although, from FIG. 4 the contact at x658 seems to be very sharp (only ~1 ft or so). The (non-adaptive) filter has smeared it out to well over a dozen ft.

Curve 27 shows the same data but with the adaptive filter applied. The following parameters are used here;

$N_{min}$=3 (minimum number of filtering levels)
$N_{max}$=51 (maximum number of filter levels, the same filter lengths as curve 26).
$Z_0$=2.5
$T_y$=10 ppk In addition the actual number of levels determined by and used by the adaptive filter is also presented graphically 28.

Clearly, in the long near-constant-value sections the adaptive method applies the maximum number of levels 28 (51) to the data and gets the same results as the non-adaptive filter curve 26. However, note that when approaching the boundary (x658 ft) from below, the method smoothly decreases the filter length to a small value, clearly preserving boundary sharpness. In fact, the contact at x658 ft is kept essentially as sharp as in the unfiltered case curve 25. Then after having passed through the boundary the method smoothly increases the filter length, applying progressively heavier filtering until reaching the maximum permitted ($N_{max}$). The contact at x680 ft is not sharp enough to trigger the adaptive filter, so results identical to the arithmetic average filter 6 are obtained.

Figure 5:
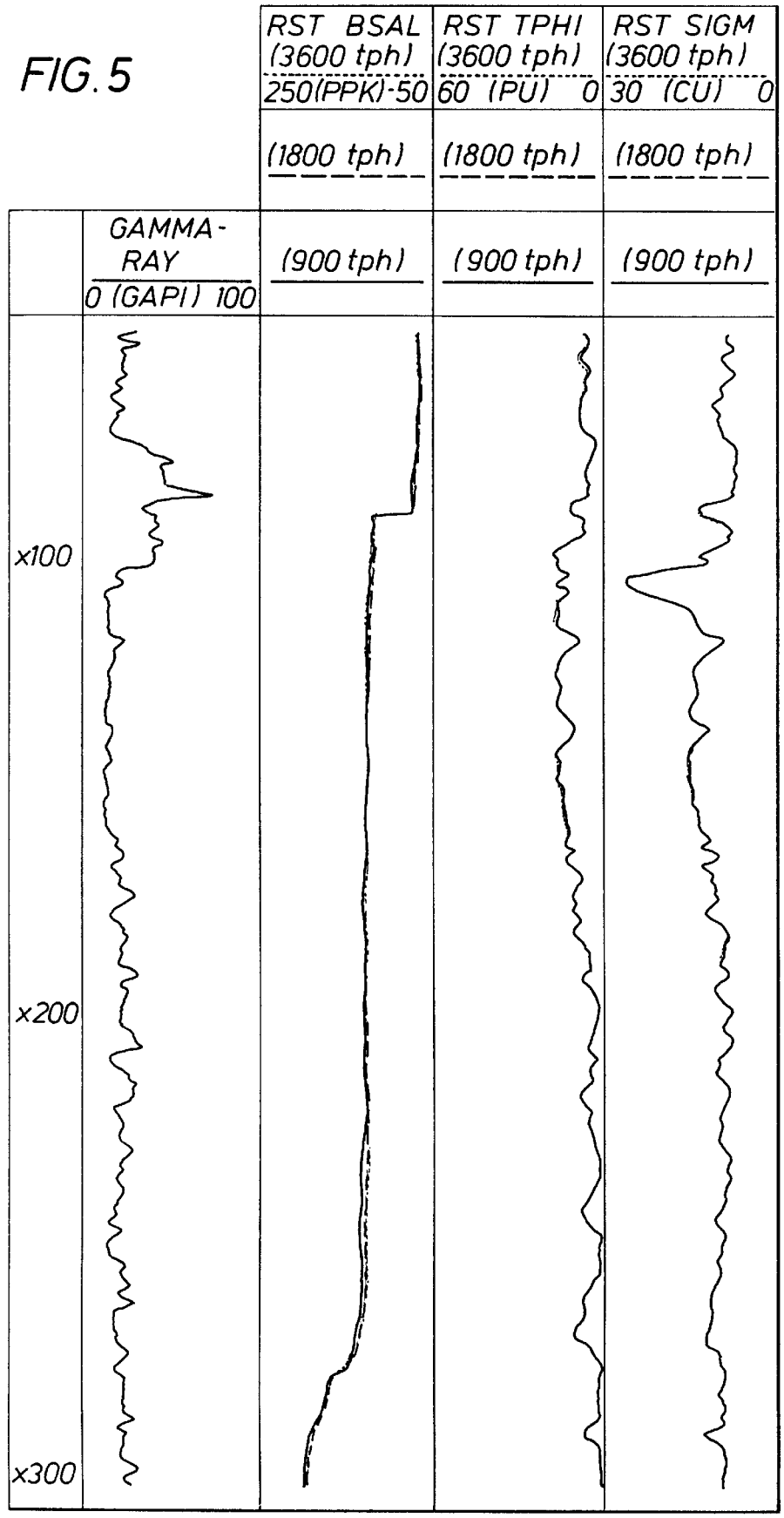
FIG. 5 shows an example of borehole salinity adaptive filtering.

In another example, FIG. 5, track 2, shows an additional example of borehole salinity adaptive filtering. Note how the extremely sharp borehole oil-water contact is preserved (just above x100 depth) while large amounts of filtering are applied in the remainder of the well where the borehole salinity is constant or very nearly constant.

Figure 6:
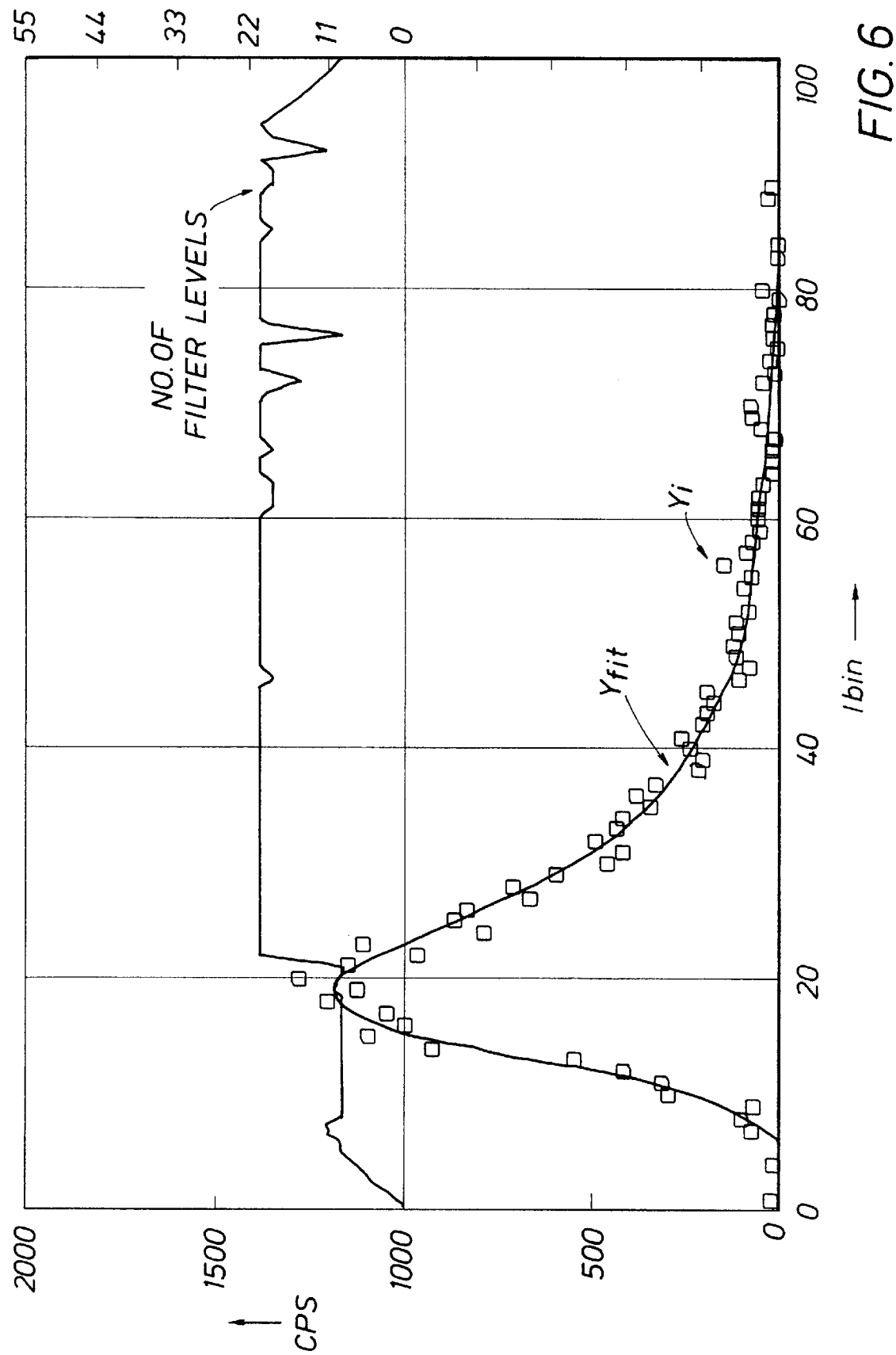
FIG. 6 shows the adaptive filter method applied to smoothing "noisy" spectra.

FIG. 6 shows the adaptive filter method applied to smoothing "noisy" spectra, in this case a slug of activated water moving past a scintillation detector. The X-axis is time and the (left) y axis is counts per second. In this case a low-order polynomial filter model has been used so as to preserve the peak shape and amplitude. The right y-axis is the number of levels of filtering used by the adaptive filter. Note that while filtering the peak area, a small number of levels was used while typically the maximum number (21 in this example) was used later in the where there was no significant count-rate structure (peaks). Note how the adaptively filtered curve ($y_{fit}$) shows the height and shape of the slug in spite of the very noisy data points ($y_i$).

The methods of this invention provide significant advantages over the current art. The invention has been described in connection with its preferred embodiments. However, it is not limited thereto. Changes, variations and modifications to the basic design may be made without departing from the inventive concepts in this invention. In addition, these changes, variations and modifications would be obvious to those skilled in the art having the benefit of the foregoing teachings. All such changes, variations and modifications are intended to be within the scope of the invention which is limited only by the following claims.

I claim:

1. A method for adaptively filtering a detected signal comprising the steps of:
a) establishing an initial maximum number $N_{max}$ of filter levels and a minimum number of filter levels $N_{min}$, wherein a filter length N is equal to $N_{max}$;
b) adjusting a filter length N based on a goodness of fit statistic Z, wherein said filter length is adjusted by:
  computing said goodness of fit statistic Z;
  comparing said goodness of fit statistic Z to a predetermined $Z_0$;
  reducing the number of N when Z is not less than $Z_0$;
  comparing said new N to $N_{min}$; and
  repeating said adjusting steps when N is greater than $N_{min}$; and
c) filtering said detected signal with said adjusted filter.

2. The method of claim 1 wherein said filter length is adjusted by:
computing said goodness of fit statistic Z;
comparing said goodness of fit statistic to a predetermined $Z_0$; and using said adjusted filter length when said Z is less than $Z_0$.

3. The method of claim 1 further comprising using said adjusted filter length when N is not greater than $N_{min}$.

4. The method of claim 1 wherein said goodness of fit statistic Z is computed as:

$$Z = \frac{\sum_{i=1}^{N} \frac{(y_i - y_{fit_i})}{(\sigma_{y_i}^2 + T_y^2)}}{N-1}$$

where N is the number of levels (depths) of data included in the calculation of Z (N being an odd integer); $y_i$ is the measurement value at level (depth) i; $y_{fit_i}$ is the fitted value for each of the N measurement values, based on the filtering model being used; $\sigma_{y_i}^2$ is the predicted variance (square of standard deviation) of measurement $y_i$; and $T_y^2$ is a "tolerance" in the determination (accuracy) of the quantity y.

5. The method of claim 1 wherein said number of filter levels N is reduced by a constant C.

6. The method of claim 5 wherein said constant C is 2.

7. The method of claim 1 wherein said pre-determined $Z_0$ is in the range of approximately 2 to 3.

8. The method of claim 1 wherein step (b) further comprises the steps of:

(i) computing said goodness of fit statistic Z;

(ii) comparing said Z to a predetermined $Z_0$;

when Z is not less than $Z_0$, (iii) computing a new maximum number of filter levels N from said existing number of filter levels;

(iv) comparing said new number of filter levels to said $N_{min}$; and, (v) repeating steps (i) and (ii) if said new filter level is greater than said $N_{min}$.

9. The method of claim 8 wherein said goodness of fit statistic Z is computed as:

$$Z = \frac{\sum_{i=1}^{N} \frac{(y_i - y_{fit_i})}{(\sigma_{y_i}^2 + T_y^2)}}{N-1}$$

where N is the number of levels (depths) of data included in the calculation of Z (N being an odd integer); $y_i$ is the measurement value at level (depth) i; $y_{fit_i}$ is the fitted value for each of the N measurement values, based on the filtering model being used; $\sigma_{y_i}^2$ is the predicted variance (square of standard deviation) of measurement $y_i$; and $T_y^2$ is a "tolerance" in the determination (accuracy) of the quantity y.

10. The method of claim 8 wherein the new number of filter levels N is computed by reducing the number of filter levels.

11. The method of claim 10 wherein said new number of filter levels is reduced by a constant C.

12. The method of claim 11 wherein said constant C is 2.

13. The method of claim 8 wherein said predetermined $Z_0$ is in the range of approximately 2 to 3.

14. The method of claim 8 wherein said goodness of fit statistic Z is computed based on Chi-square statistics.

15. The method of claim 1 wherein step (b) further comprises the steps of:

(i) computing said goodness of fit statistic Z;

(ii) comparing said Z to a predetermined $Z_0$;

when Z is not less than $Z_0$, (iii) computing a new minimum number of filter levels N from said existing number of filter levels;

(iv) comparing said new number of filter levels to said $N_{max}$; and, repeating steps (i) and (ii) if said new filter level is greater than said $N_{max}$.

16. The method of claim 15 wherein the new number of filter levels N is computed by increasing the number of filter levels.

17. The method of claim 16 wherein said new number of filter levels N is increased by a constant C.

* * * * *